(12) United States Patent
Wang et al.

(10) Patent No.: US 12,412,629 B2
(45) Date of Patent: Sep. 9, 2025

(54) MEMORY DEVICE AND OPERATING METHOD FOR MEMORY DEVICE

(71) Applicant: MACRONIX International Co., Ltd., Hsinchu (TW)

(72) Inventors: Chen Wang, New Taipei (TW); Ya-Jui Lee, Taichung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 251 days.

(21) Appl. No.: 18/474,619

(22) Filed: Sep. 26, 2023

(65) Prior Publication Data
US 2025/0104773 A1   Mar. 27, 2025

(51) Int. Cl.
*G11C 16/04*   (2006.01)
*G11C 16/08*   (2006.01)
*G11C 16/14*   (2006.01)

(52) U.S. Cl.
CPC .......... *G11C 16/14* (2013.01); *G11C 16/0483* (2013.01); *G11C 16/08* (2013.01)

(58) Field of Classification Search
CPC ..................................................... G11C 16/04
See application file for complete search history.

(56) References Cited

U.S. PATENT DOCUMENTS

| 10,283,204 B2 | 5/2019 | Choi et al. |
| 10,354,737 B2 | 7/2019 | Hu |
| 2015/0270005 A1* | 9/2015 | Choi ........................ G11C 8/18 365/185.11 |
| 2015/0331627 A1 | 11/2015 | Kwak |

OTHER PUBLICATIONS

"Office Action of Taiwan Counterpart Application", issued on Aug. 28, 2024, pp. 1-8.

* cited by examiner

*Primary Examiner* — Jason Lappas
(74) *Attorney, Agent, or Firm* — J.C. PATENTS (57) ABSTRACT

A memory device and an operating method for the memory device are provided. The memory device includes a memory array and a control circuit. The memory array includes memory blocks. Each of the memory blocks is, for example a three-dimensional NAND flash memory block. The memory device provides a storage media with high-performance and high-capacity. The control circuit provides a first erasing voltage to perform a first erasing operation on target memory cell strings of a selected memory block in the memory blocks, performs a programming operation on the target memory cell strings after the first erasing operation, and provides a second erasing voltage to perform a second erasing operation on at least one part of memory cells of each of the target memory cell strings after the programming operation. The second erasing voltage is lower than the first erasing voltage.

20 Claims, 7 Drawing Sheets

MEMORY DEVICE AND OPERATING METHOD FOR MEMORY DEVICE

BACKGROUND

Technical Field

The disclosure generally relates to a memory device and an operating method for the memory device, and more particularly to a memory device and an operating method for the memory device for decreasing difference between charge losses of memory cells in the memory device.

Description of Related Art

Generally, a charge retention (or data retention) plays an important role for product qualification of the memory device. Different charge losses of the memory cells of the memory device may impact on an as-programed Error-Correcting operation or a read operation. When charge losses of the memory cells are different, read windows of memory cells of the memory device are different. Particularly, for multi-level cells (for example, Triple-level cells (TLC)) application, an error of a data reading operation or an as-programed Error-Correcting operation of may be occurred. Thus, how to decrease difference between the charge losses of the memory cells is one of the research priorities for the skilled in the art.

SUMMARY

The disclosure provides a memory device and an operating method for decreasing difference between the charge losses of memory cells of the memory device.

The memory device includes a memory array and a control circuit. The memory array includes memory blocks. The control circuit is coupled to the memory array. The control circuit provides a first erasing voltage to perform a first erasing operation on target memory cell strings of a selected memory block in the memory blocks, performs a programming operation on the target memory cell strings after the first erasing operation, and provides a second erasing voltage to perform a second erasing operation on at least one part of memory cells of each of the target memory cell strings after the programming operation. The second erasing voltage is lower than the first erasing voltage.

The operating method is used for the memory device. The memory device includes a memory array. The memory array comprises memory blocks. The operating method includes: providing a first erasing voltage to perform a first erasing operation on target memory cell strings of a selected memory block in the memory blocks; performing a programming operation on the target memory cell strings after the first erasing operation; and providing a second erasing voltage to perform a second erasing operation on at least one part of memory cells of each of the target memory cell strings after the programming operation, wherein the second erasing voltage is lower than the first erasing voltage.

Based on the above, the memory device performs the second erasing operation on at least one part of memory cells of each of the target memory cell strings after the programming operation. The second erasing operation may adjust charge losses of the memory cells after the programming operation. The difference between the charge losses of memory cells could be decreased. Therefore, a difference between charge losses of memory cells could be decreased.

To make the aforementioned more comprehensible, several embodiments accompanied with drawings are described in detail as follows.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Figure 1:
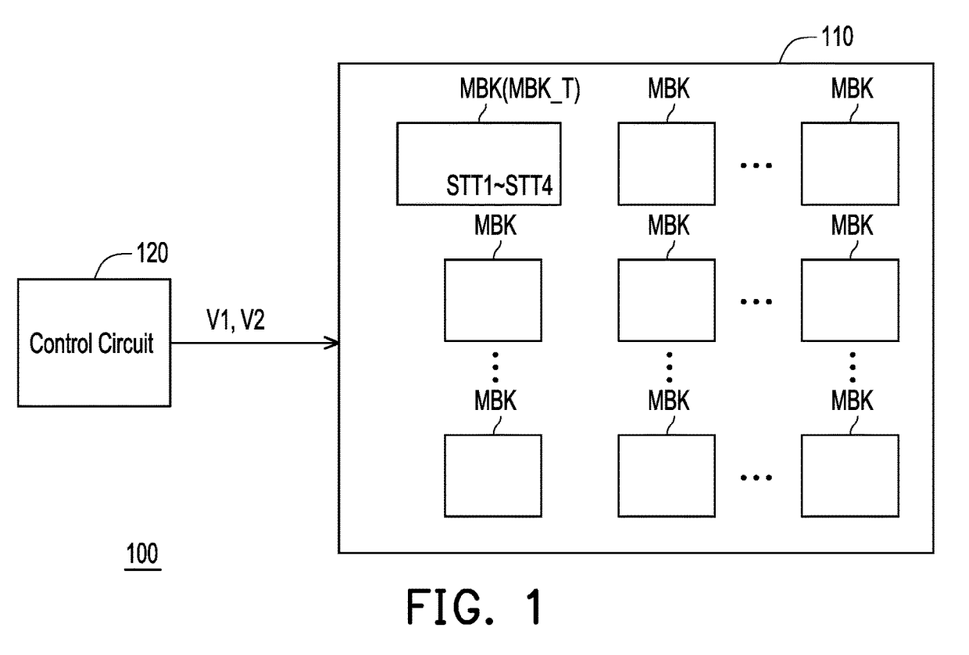
FIG. 1 illustrates a schematic diagram of a memory device according to an embodiment of the disclosure.

Please refer to FIG. 1, FIG. 1 illustrates a schematic diagram of a memory device according to an embodiment of the disclosure. In the embodiment, the memory device 100 includes a memory array 110 and a control circuit 120. The memory array 110 includes memory blocks MBK. For example, each of the memory blocks MBK may be NAND flash memory block, but the disclosure is not limited thereto.

In the embodiment, the control circuit 120 is coupled to the memory array 110. The control circuit 120 provides a first erasing voltage V1 to perform a first erasing operation on target memory cell strings STT1 to STT4 of a selected memory block MBK_T in the memory blocks MBK. For example, the control circuit 120 selects the selected memory block MBK_T among the memory blocks MBK in response to a command and then performs the first erasing operation on the target memory cell strings STT1 to STT4 of a selected memory block MBK_T. The control circuit 120 performs a programming operation on the target memory cell strings STT1 to STT4 after the first erasing operation.

In the embodiment, the control circuit 120 provides a second erasing voltage V2 to perform a second erasing operation on at least one part of memory cells of each of the target memory cell strings STT1 to STT4 after the programming operation. The second erasing voltage V2 is lower than the first erasing voltage V1. In the embodiment, the "at least one part of memory cells" includes at least one memory cell.

It should be noted, after performing the programming operation, the memory device 100 performs the second erasing operation on at least one part of memory cells of each of the target memory cell strings STT1 to STT4 in the selected memory block MBK_T. The second erasing operation could adjust charge losses of the memory cells after the programming operation. The difference between the charge losses of memory cells could be decreased. Therefore, a difference between read windows of memory cells could be decreased. Besides, for triple-level cells (TLC) application, because the difference between the charge losses is decreased, an error of a data reading operation or an as-programed Error-Correcting operation of may also be decreased. Therefore, the memory device 100 provides a storage media with high-performance and high-capacity.

In the embodiment, the at least one part of memory cells performed by the second erasing operation may be determined by a verify operation or an error-correcting operation. Generally, the verify operation and error-correcting operation is performed in the programming operation or after the programming operation. In the embodiment, the at least one part of memory cells performed by the second erasing operation may be determined by different area and/or different layer in the selected memory block MBK_T.

For example, based on different area, different layer and/or yield, a first part of the memory cells in the selected memory block MBK_T has a first charge loss. A second part of the memory cells in the selected memory block MBK_T has a second charge loss. The first charge loss is different from the second charge loss. The control circuit 120 performs the second erasing operation on the second part of the memory cells. Therefore, the second charge loss is adjusted to the first charge loss.

Figure 2:
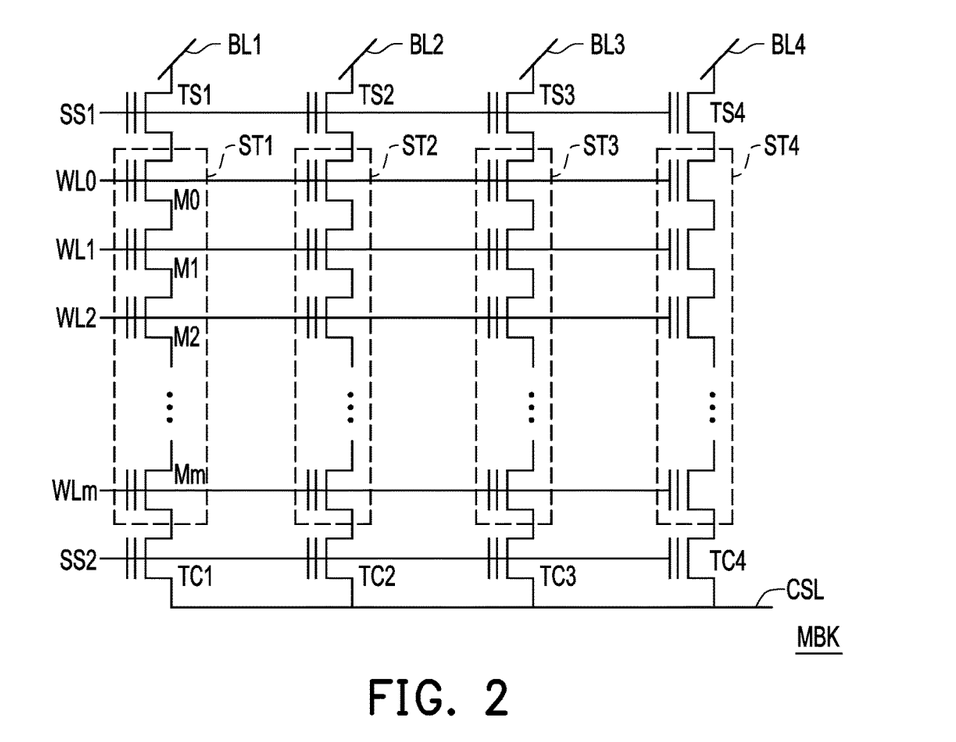
FIG. 2 illustrates a schematic diagram of a memory block according to an embodiment of the disclosure.
Figure 3:
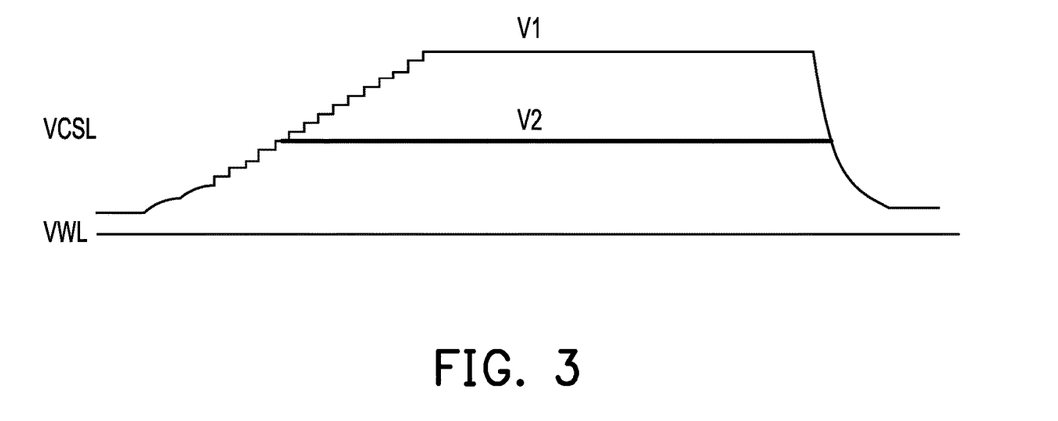
FIG. 3 illustrates waveforms of a first erasing voltage and a second erasing voltage according to an embodiment of the disclosure.

Please refer to FIG. 1, FIG. 2 and FIG. 3, FIG. 2 illustrates a schematic diagram of a memory block according to an embodiment of the disclosure. FIG. 3 illustrates waveforms of a first erasing voltage and a second erasing voltage according to an embodiment of the disclosure. In the embodiment, the memory block MBK includes string select transistors TS1 to TS4, source select transistors TC1 to TC4 and memory cell strings ST1 to ST4. The memory block MBK may be a two-dimensional NAND flash memory block, but the disclosure is not limited thereto. A first terminal of the string select transistor TS1 is connected to a bit line BL1. A second terminal of the string select transistor TS1 is connected to a terminal of the memory cell string ST1. A control terminal of the string select transistor TS1 receives a select signal SS1. The memory cell string ST1 includes memory cells M0 to Mm connected in series. A control terminal of the memory cell M0 is connected to a word line WL0. A control terminal of the memory cell M1 is connected to a word line WL1, and so on. A first terminal of the source select transistor TC1 is connected to another terminal of the memory cell string ST1. A second terminal of the source select transistor TC1 is connected to a common source line CSL. A control terminal of the selecting transistor TC1 receives a select signal SS2.

In other words, the string select transistor TS1, the source select transistor TC1 and the memory cell string ST1 are connected in series between the bit line BL1 and the common source line CSL.

Similarly, the string select transistor TS2, the source select transistor TC2 and the memory cell string ST2 are connected in series between a bit line BL2 and the common source line CSL. The string select transistor TS3, the source select transistor TC3 and the memory cell string ST3 are connected in series between a bit line BL3 and the common source line CSL. The string select transistor TS4, the source select transistor TC4 and the memory cell string ST4 are connected in series between a bit line BL4 and the common source line CSL. The string select transistors TS1 to TS4 receive the select signal SS1. The source select transistors TC1 to TC4 receive the select signal SS2. Besides, the memory cell strings ST1 to ST4 are connected to the word lines WL0 to WLm. Thus, memory cells in the memory cell strings ST1 to ST4 corresponding to the word line WL0 may be one memory page. Memory cells in the memory cell strings ST1 to ST4 corresponding to the word line WL1 may be another memory page.

In the embodiment, each of the memory cell strings ST1 to ST4 may be NAND flash memory string, but the disclosure is not limited thereto.

In the embodiment, the string select transistors TS1 to TS4 and the source select transistors TC1 to TC4 are turned on. The memory block MBK in FIG. 2 is selected. Thus, the memory block MBK is the selected memory block MBK_T. The memory cell strings ST1 to ST4 in FIG. 2 are the target memory cell strings STT1 to STT4 respectively. When performing the first erasing operation, the control circuit 120 applies the first erasing voltage V1 to the common source line CSL. Therefore, a voltage of the common source line signal VCSL provided to the common source line CSL is substantially equal to the first erasing voltage V1 when performing the first erasing operation. In the embodiment, the control circuit 120 applies a word line signal VWL having substantially zero voltage to the word lines WL0 to WLm when performing the first erasing operation. When performing the first erasing operation, data in all of the memory cells of each of memory cell strings ST1 to ST4 are erased based on the first erasing voltage V1.

When performing the second erasing operation, the control circuit 120 applies the second erasing voltage V2 to the common source line CSL. The voltage of the common source line signal VCSL is substantially equal to the second erasing voltage V2 when performing the second erasing operation. The control circuit 120 applies substantially zero voltage to corresponding word lines which is connected to the part of memory cells.

In some embodiments, the control circuit 120 applies the first erasing voltage V1 to the bit lines BL1 to BL4 when performing the first erasing operation. The control circuit 120 applies the second erasing voltage V2 to the bit lines BL1 to BL4 when performing the second erasing operation.

In some embodiments, the control circuit 120 applies the first erasing voltage V1 to the bit lines BL1 to BL4 and the common source line CSL when performing the first erasing operation. The control circuit 120 applies the second erasing voltage V2 to the bit lines BL1 to BL4 and the common source line CSL when performing the second erasing operation.

In the embodiment, the second erasing voltage V2 is lower than the first erasing voltage V1. Thus, the first erasing operation is called as a "normal erasing operation". The second erasing operation is called as a "weak erasing operation". For example, a difference between the first erasing voltage V1 and second erasing voltage V2 is in a range of 7 volts to 13 volts. For example, the second erasing voltage V2 is substantially 8 volts, but the disclosure is not limited thereto. The first erasing voltage V1 is substantially 20 volts, but the disclosure is not limited thereto.

Figure 4:
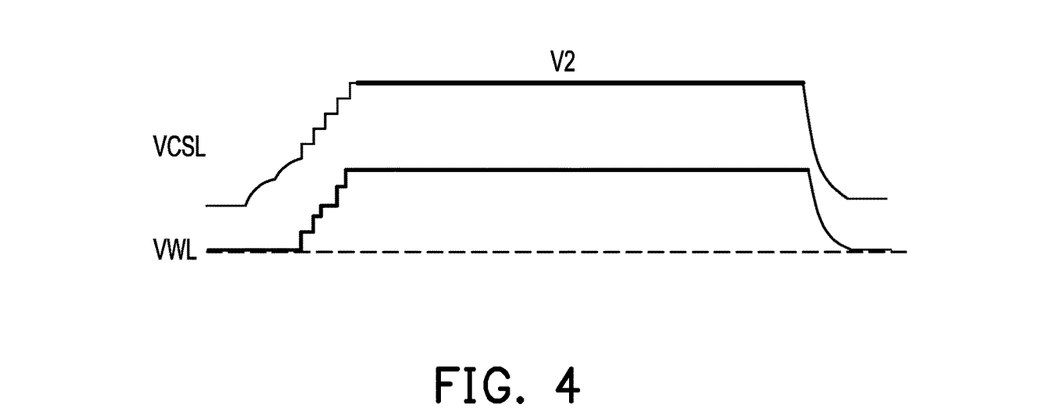
FIG. 4 illustrates waveforms of a word line signal and a second erasing voltage corresponding to a remaining part of memory cells according to an embodiment of the disclosure.

Besides, please refer to FIG. 1, FIG. 3 and FIG. 4, FIG. 4 illustrates waveforms of a word line signal and a second erasing voltage corresponding to a remaining part of memory cells according to an embodiment of the disclosure. The remaining part of memory cells is excluded from the at least one part of memory cells of each of the target memory cell strings STT1 to STT4 in the second erasing operation. In the embodiment, the control circuit 120 does not perform the second erasing operation on the remaining part of memory cells of each of the target memory cell strings ST1 to ST4. When performing the second erasing operation, the control circuit 120 floats the remaining part of memory cells. For example, when performing the second erasing operation, word lines corresponding to the remaining part of memory cells are floated. Thus, a voltage of the word line signal VWL follows the second erasing voltage V2 based on a capacitive coupling effect in the remaining part of memory cells.

Figure 5:
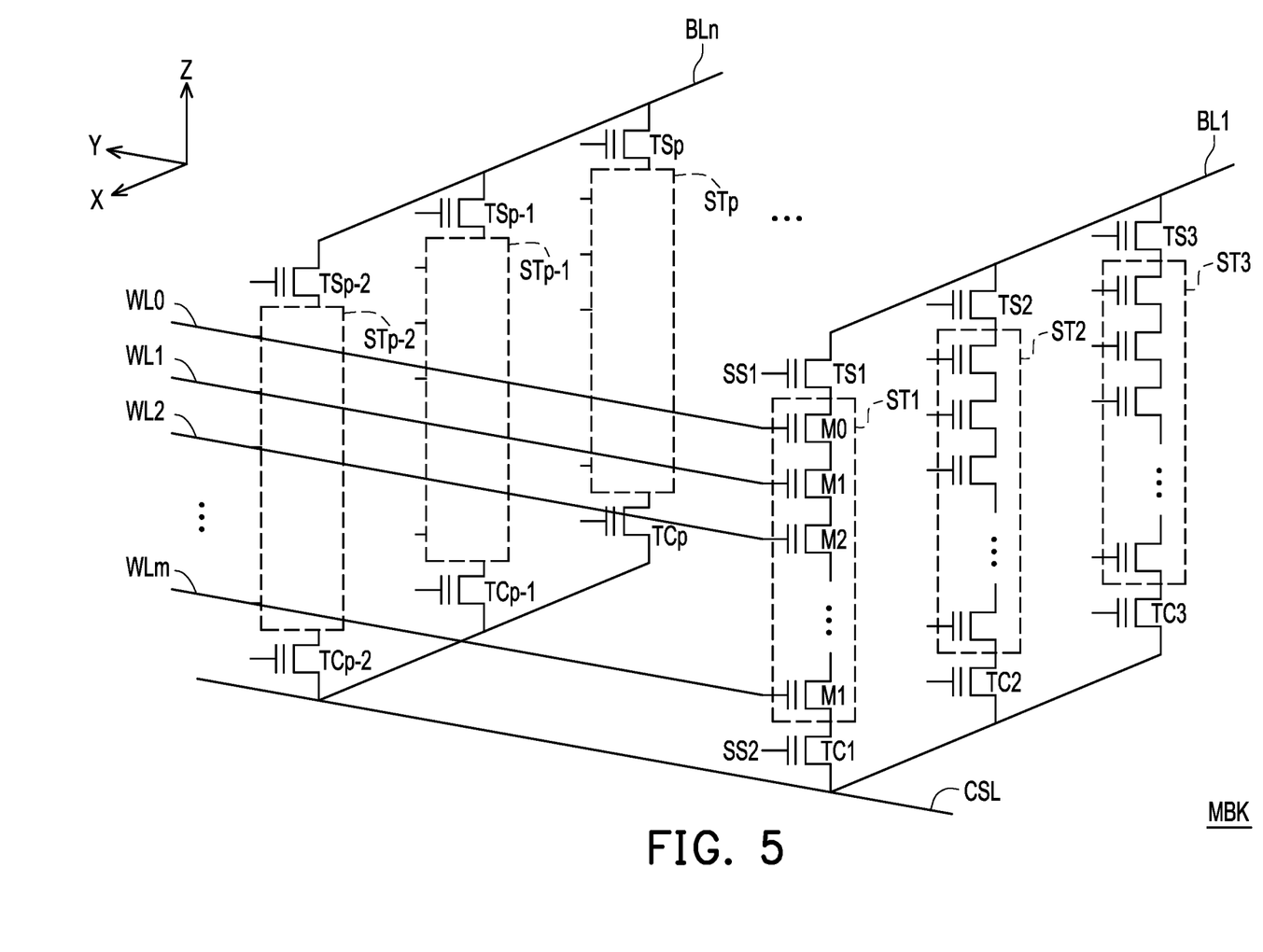
FIG. 5 illustrates a schematic diagram of a memory block according to an embodiment of the disclosure.

Please refer to FIG. 1, FIG. 3 and FIG. 5, FIG. 5 illustrates a schematic diagram of a memory block according to an embodiment of the disclosure. The memory block MBK may be a three-dimensional NAND flash memory block. In the embodiment, the memory block MBK at least includes a common source line CSL, bit lines BL1 to BLn, word lines WL0 to WLm, string select transistors TS1 to TSp, source select transistors TC1 to TCp and memory cell strings ST1 to STp. Each of the memory cell strings ST1 to STp is respectively coupled between a corresponding bit line of the bit lines BL1 to BLn and the common source line CSL. Memory cells of each of the memory cell strings ST1 to STp are connected in series along the third direction Z. Each of memory cells of each of the target memory cell strings ST1 to STp is respectively coupled to a corresponding word line of word lines WL0 to WLm.

In the embodiment, the string select transistor TS1, the memory cell string ST1 and the source select transistor TC1 are connected in series between the bit line BL1 and the common source line CSL. The string select transistor TS2, the memory cell string ST2 and the source select transistor TC2 are connected in series between the bit line BL2 and the common source line CSL. Similarly, the string select transistor TSp, the memory cell string STp and the source select transistor TCp are connected in series between the bit line BLn and the common source line CSL.

In the embodiment, the bit lines BL1 to BLn extend along a first direction X. The bit lines BL1 to BLn are arranged along a second direction Y. The word lines WL0 to WLm extend along a plane defined by the first direction X and the second direction Y. The word lines WL0 to WLm are arranged along a third direction Z. The first direction X, the second direction Y and the third direction Z are non-parallel to each other.

In the embodiment, memory cells in different memory strings corresponding to the word line WL0 may be one memory page. Memory cells in different memory strings corresponding to the word line WLm may be another memory page.

In the embodiment, the string select transistors TS1 to TSp and source select transistors TC1 to TCp are turned on. The memory block MBK in FIG. 5 is selected. Thus, the memory block MBK is the selected memory block MBK_T. The memory cell strings ST1 to STp are the target memory cell strings respectively. When performing the first erasing operation, the control circuit 120 applies the first erasing voltage V1 to the common source line CSL. The voltage of the common source line signal VCSL is substantially equal to the first erasing voltage V1 when performing the first erasing operation. The control circuit 120 applies substantially zero voltage to the word lines WL0 to WLm. Therefore, when performing the first erasing operation, all of data of the memory cells of the memory cell strings ST1 to STp are erased based on the first erasing voltage V1.

When performing the second erasing operation, the control circuit 120 applies the second erasing voltage V2 to the common source line CSL. The voltage of the common source line signal VCSL is substantially equal to the second erasing voltage V2 when performing the second erasing operation. The control circuit 120 applies substantially zero voltage to corresponding word lines connected to the at least one part of memory cells.

In some embodiments, the control circuit 120 applies the first erasing voltage V1 to the corresponding bit lines when performing the first erasing operation. The control circuit 120 applies the second erasing voltage V2 to the corresponding bit lines when performing the second erasing operation.

In some embodiments, the control circuit 120 applies the first erasing voltage V1 to the bit lines BL and the common source line CSL when performing the first erasing operation. The control circuit 120 applies the second erasing voltage V2 to the corresponding bit lines and the common source line CSL when performing the second erasing operation.

A remaining part of memory cells is excluded from the at least one part of memory cells of each of the target memory cell strings STT1 to STT4 in the second erasing operation. Hence, the control circuit 120 does not perform the second erasing operation on the remaining part of memory cells of each of the target memory cell strings ST1 to STp. When performing the second erasing operation, the remaining part of memory cells is floated. For example, when performing the second erasing operation, word lines corresponding to the remaining part of memory cells are floated.

Figure 6:
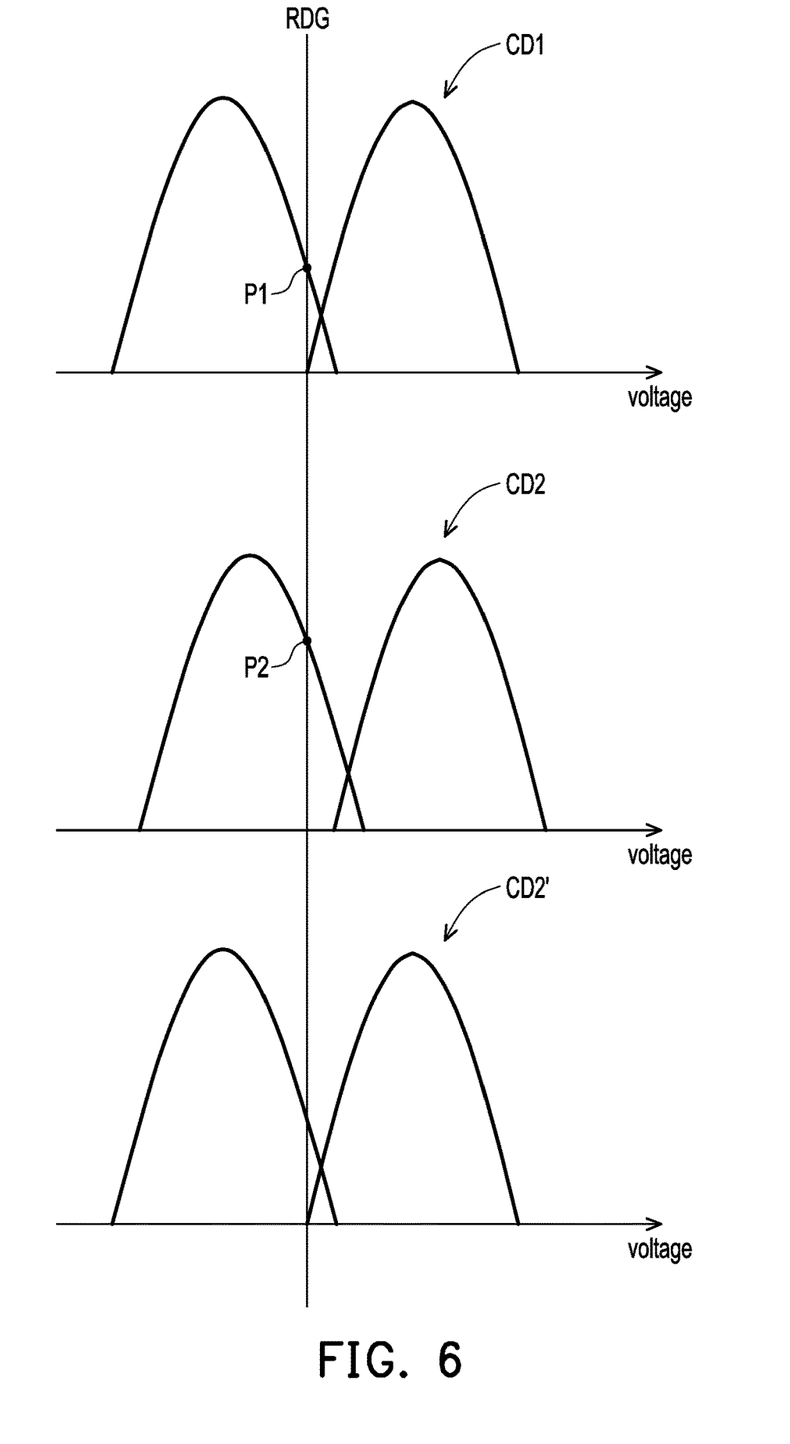
FIG. 6 illustrates a schematic diagram of charge distributions according to an embodiment of the disclosure.

Please refer to FIG. 1 and FIG. 6, FIG. 6 illustrates a schematic diagram of charge distributions according to an embodiment of the disclosure. In the embodiment, FIG. 6 illustrates a charge distribution CD1 of first memory cells having the first charge loss and a charge distribution CD2 of second memory cells having the second charge loss.

In the embodiment, the first charge loss and the second charge loss are illustrated in FIG. 6. The first charge loss is represented as a more amount of charge loss after the programming operation. The second charge loss is represented as a less amount of charge loss after the programming operation. It should be noted, after the programming operation, an intersection point P2 of a judge voltage RDG and the charge distribution CD2 is higher than an intersection point P1 of the judge voltage RDG and the charge distribution CD1. In other words, a charge amount in charge distribution CD2 over the judge voltage RDG is higher than a charge amount in charge distribution CD1 over the judge voltage RDG. It means that the charge distribution CD2 has less charge loss. Therefore, the second memory cells have a worse ECC result. In order to result of the second memory cells, the intersection point P2 must be improve the ECC decreased.

In the embodiment, the control circuit 120 performs the second erasing operation on the second memory cells. After performing the second erasing operation, the second charge loss of the second memory cells are adjusted to the first charge loss. Therefore, the charge distribution CD2 of the second memory cells is adjusted to be a charge distribution CD2' similar to the charge distribution CD1. The charge amount of charge distribution CD2' over the judge voltage RDG is similar to the charge amount of charge distribution CD1 over the judge voltage RDG. Therefore, the ECC result of the second memory cells is improved.

Figure 7:
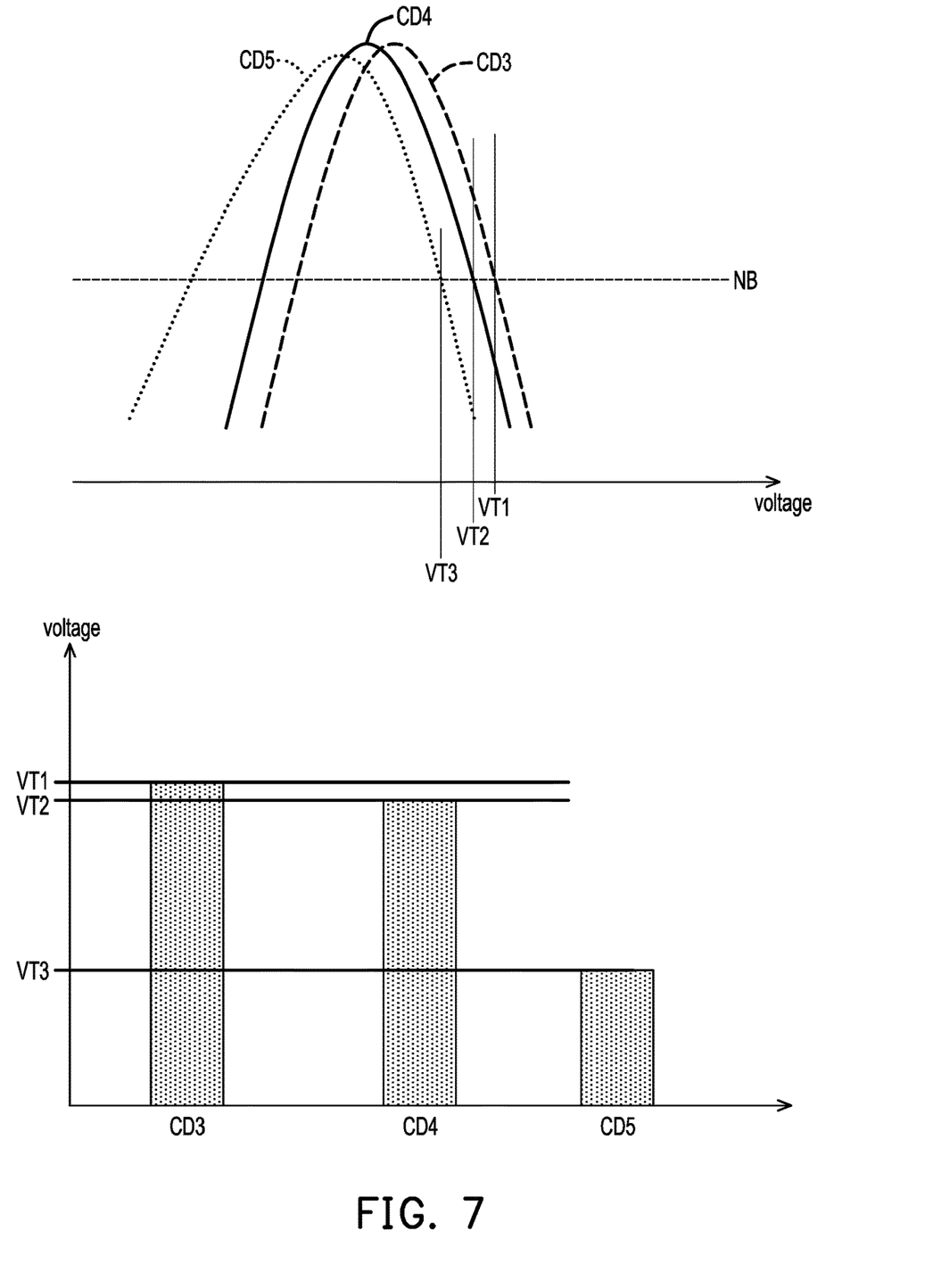
FIG. 7 illustrates a schematic diagram of charge distributions and threshold voltages corresponding different second erasing voltage according to an embodiment of the disclosure.

Detailly, please refer to FIG. 1 and FIG. 7, FIG. 7 illustrates a schematic diagram of charge distributions and threshold voltages corresponding different second erasing voltage according to an embodiment of the disclosure. FIG. 7 illustrates charge distributions CD3 to CD5 of a memory cell corresponding to one data level. The charge distribution CD3 is expressed as a charge distribution without performing the second erasing operation. The charge distribution CD3 is a charge distribution after the programming operation. Each of the charge distributions CD4 and CD5 is expressed as a different charge distribution after performing the second erasing operation. After performing the second erasing operation, based on a fixed threshold charge number NB, a threshold voltage of the memory cells is adjusted from a threshold voltage VT1 corresponding to the charge distribution CD3 to a threshold voltage VT2 corresponding to the charge distribution CD4. The threshold voltage VT2 is lower than the threshold voltage V1.

Besides, if the second erasing voltage V2 is increased, the threshold voltage is adjusted from a threshold voltage VT1 corresponding to the charge distribution CD3 to a threshold voltage VT3 corresponding to the charge distribution CD5. The threshold voltage VT3 is lower than the second erasing voltage V2.

Therefore, based on actual situations, the second erasing voltage V2 could be adjusted.

Figure 8:
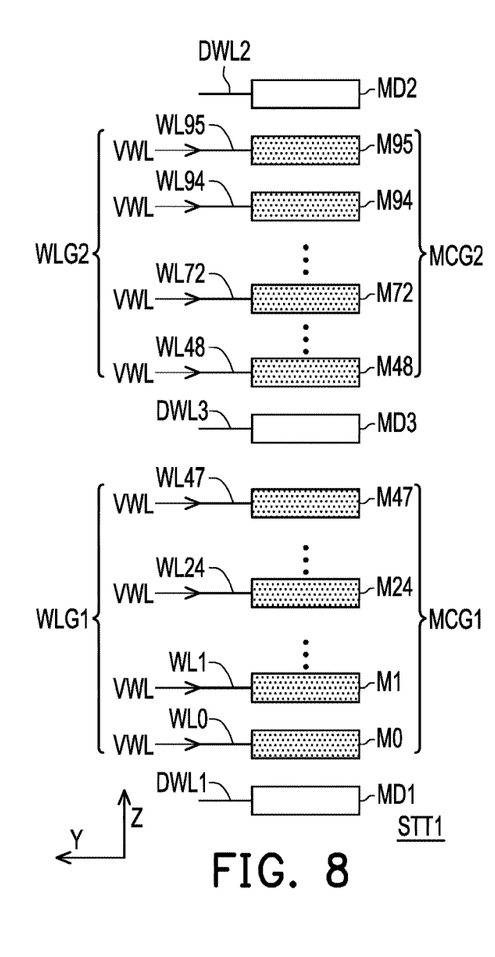
FIG. 8 illustrates a schematic diagram of a target memory cell string according to an embodiment of the disclosure.

Please refer to FIG. 1 and FIG. 8, FIG. 8 illustrates a schematic diagram of a target memory cell string according to an embodiment of the disclosure. In the embodiment, the target memory cell string STT1 is in the selected memory block MBK_T. The selected memory block MBK_T may be a three-dimensional NAND flash memory block as shown in FIG. 5. The target memory cell string STT1 includes dummy cells MD1 to MD3 and memory cells M0 to M95. The selected memory block MBK_T includes word lines WL0 to WL95 and dummy word lines DWL1 to DWL3.

In the embodiment, the dummy word lines DWL1 and DWL2 extend along the plane defined by the first direction (that is, the first direction X in FIG. 5) and the second direction Y. The word lines WL0 to WL95 are arranged between the dummy word line DWL1 and DWL2.

The dummy word line DWL3 is arranged between the dummy word line DWL1 and DWL2. The dummy word line DWL3 extends along the second direction Y.

In the embodiment, the memory cells M0 to M95 are divided into a first memory cell group MCG1 and a second memory cell group MCG2 by the dummy cell MD3. For example, the first memory cell group MCG1 is arranged between dummy cells MD1 and MD3. The first memory cell group MCG1 includes the memory cells M0 to M47. The second memory cell group MCG2 is arranged between dummy cells MD2 and MD3. The second memory cell group MCG2 includes the memory cells M48 to M95, but the disclosure is not limited thereto. The first memory cell group MCG1 may be a first deck in a 3D NAND flash block. The second memory cell group MCG2 may be a second deck different from the first deck in the 3D NAND flash block. In one example, the second deck is above the first deck in the 3D NAND flash block.

In the embodiment, the dummy word line DWL1 is connected to the dummy cell MD1. The dummy word line DWL2 is connected to the dummy cell MD2. The dummy word line DWL3 is connected to the dummy cell MD3. The word line WL0 is connected to the memory cell M0. The word line WL1 is connected to the memory cell M1, and so on. The word lines WL0 to WL95 are divided into a first word line group WLG1 and a second word line group WLG2 by the dummy word line DWL3. The first word line group WLG1 includes the word lines WL0 to WL47. The second word line group WLG2 includes the word lines WL48 to WL95.

In the embodiment, when performing the second erasing operation, the control circuit 120 applies the second erasing voltage V2 to the bit line corresponding to the target memory cell string STT1 and/or the common source line. When performing the second erasing operation, the control circuit 120 further applies the word line signal VWL having substantially zero voltage to the first word line group WLG1 and the second word line group WLG2. Therefore, the control circuit 120 performs the second erasing operation on all of the memory cells M0 to M95.

Figure 9:
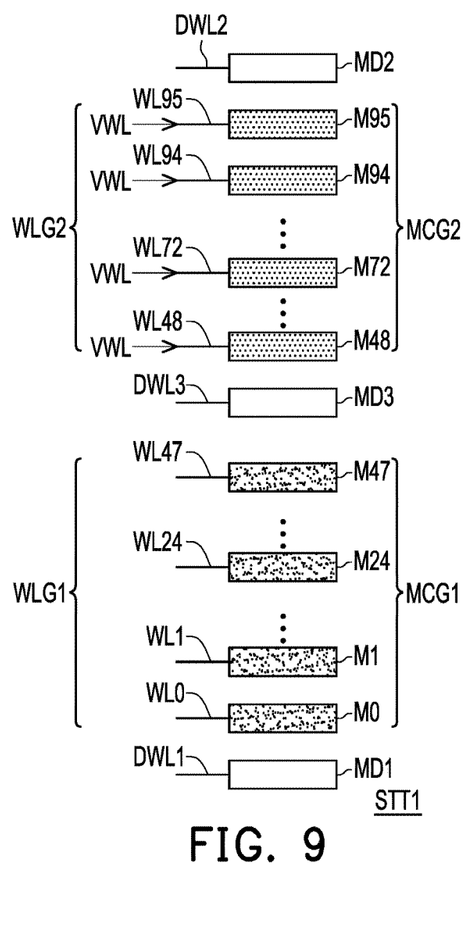
FIG. 9 illustrates a schematic diagram of a target memory cell string according to an embodiment of the disclosure.

Please refer to FIG. 1 and FIG. 9, FIG. 9 illustrates a schematic diagram of a target memory cell string according to an embodiment of the disclosure. In the embodiment, the connection of the target memory cell string STT1, the word lines WL0 to WL95 and the dummy word lines DWL1 to DWL3 has been clearly explained in above embodiment of FIG. 8, so it will not be repeated here. In the embodiment, when performing the second erasing operation, the control circuit 120 applies the second erasing voltage V2 to the bit line corresponding to the target memory cell string STT1 and/or the common source line. When performing the second erasing operation, the control circuit 120 applies the word line signal VWL having substantially zero voltage to the second word line group WLG2. Besides, the control circuit 120 floats the first word line group WLG1. Therefore, the control circuit 120 performs the second erasing operation on the memory cells M48 to M95. But, the control circuit 120 does not perform the second erasing operation on the memory cells M0 to M47 (that is, the remaining part of memory cells).

In some embodiments, when performing the second erasing operation, the control circuit 120 applies the word line signal VWL having substantially zero voltage to the first word line group WLG1 and floats the second word line group WLG2. Therefore, the control circuit 120 performs the second erasing operation on the memory cells M0 to M47.

Based on FIG. 8 and FIG. 9, the control circuit 120 may apply substantially zero voltage to at least one of the first word line group WLG1 and the second word line group WLG2.

Figure 10:
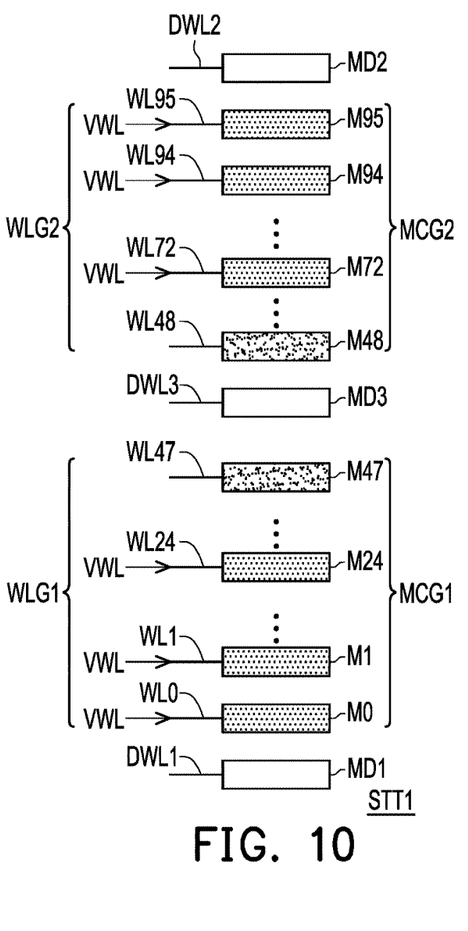
FIG. 10 illustrates a schematic diagram of a target memory cell string according to an embodiment of the disclosure.

Please refer to FIG. 1 and FIG. 10, FIG. 10 illustrates a schematic diagram of a target memory cell string according to an embodiment of the disclosure. In the embodiment, the connection of the target memory cell string STT1, the word lines WL0 to WL95 and the dummy word lines DWL1 to DWL3 has been clearly explained in above embodiment of FIG. 8, so it will not be repeated here. In the embodiment, the control circuit 120 floats at least one word line adjacent to the third dummy word line DWL3 in the first word line group WLG1 and the second word line group WLG2 when performing the second erasing operation. For example, the word line WL47 in the first word line group WLG1 and the word line WL48 in the second word line group WLG2 are adjacent to the third dummy word line DWL3. When performing the second erasing operation, the control circuit 120 applies the second erasing voltage V2 to the bit line corresponding to the target memory cell string STT1 and/or the common source line. When performing the second erasing operation, the control circuit 120 applies the word line signal VWL having substantially zero voltage to the word lines WL0 to WL46 and WL49 to WL95. Therefore, the control circuit 120 performs the second erasing operation on the memory cells M0 to M46 and M49 to M95. The control circuit 120 floats the word lines WL47 and WL48 adjacent to the third dummy word line DWL3 when performing the second erasing operation. Therefore, the control circuit 120 does not perform the second erasing operation on the memory cells M47 and M48 (that is, the remaining part of memory cells).

Figure 11:
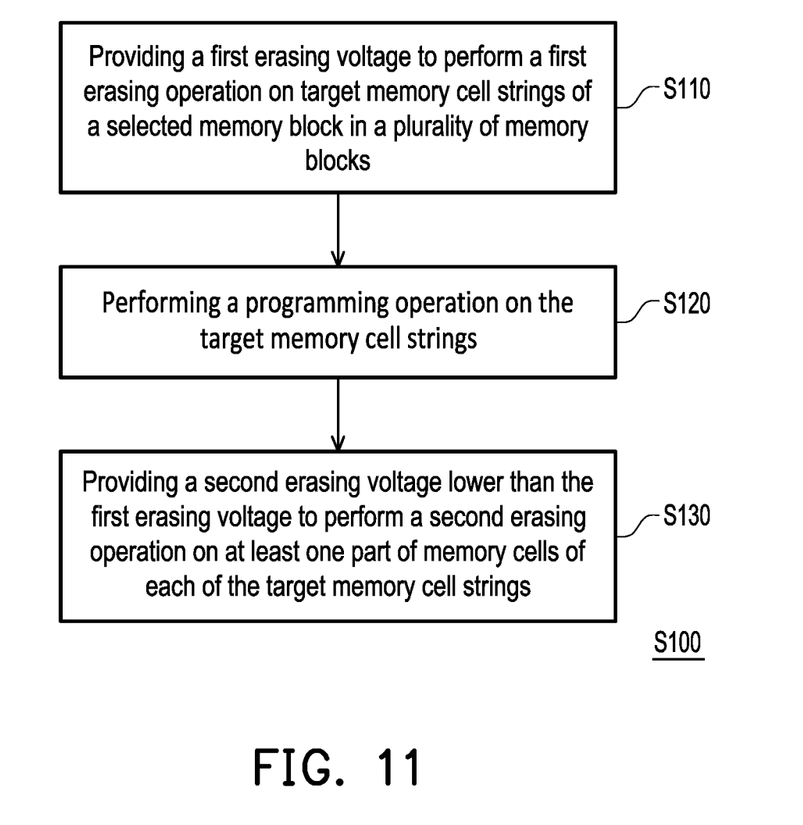
FIG. 11 illustrates a flow diagram of an operating method according to an embodiment of the disclosure.

Please refer to FIG. 1 and FIG. 11, FIG. 11 illustrates a flow diagram of an operating method according to an embodiment of the disclosure. In the embodiment, the operating method S100 is used for the memory device 100. The operating method S100 includes steps S110 to S130. In the step S110, the control circuit 120 provides the first erasing voltage V1 to perform the first erasing operation on target memory cell strings STT1 to STT4 of the selected memory block MBK_T in the memory blocks MBK. In the step S120, the control circuit 120 performs the programming operation on the target memory cell strings STT1 to STT4 after the first erasing operation. In the step S130, the control circuit 120 provides the second erasing voltage V2 to perform the second erasing operation on at least one part of memory cells of each of the target memory cell strings STT1 to STT4 after the programming operation. The second erasing voltage V2 is lower than the first erasing voltage V1. The first erasing operation and the second erasing operation have been clearly explained in at least one of the embodiments of FIG. 1 to FIG. 10, so it will not be repeated here.

In view of the foregoing, the memory device performs the second erasing operation on at least one part of memory cells of each of the target memory cell strings after the programming operation. The second erasing operation may adjust charge losses of the memory cells after the programming operation. The difference between the charge losses of memory cells could be decreased. Therefore, a difference between the read windows of memory cells could be decreased. Besides, for triple-level cells application, because the difference between the charge losses is decreased, an error of a data reading operation or an as-programed Error-Correcting operation of may also be decreased. Therefore, the memory device provides a storage media with high-performance and high-capacity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a memory array, comprising a plurality of memory blocks; and
a control circuit, coupled to the memory array, and configured to provide a first erasing voltage to perform a first erasing operation on a plurality of target memory cell strings of a selected memory block in the plurality of memory blocks, perform a programming operation on the plurality of target memory cell strings after the first erasing operation, and provide a second erasing voltage to perform a second erasing operation on at least one part of memory cells of each of the plurality of target memory cell strings after the programming operation, wherein the second erasing voltage is lower than the first erasing voltage.

2. The memory device of claim 1, wherein a difference between the first erasing voltage and second erasing voltage is in a range of 7 volts to 13 volts.

3. The memory device of claim 1, wherein the control circuit applies substantially zero voltage to one or more corresponding word lines connected to the at least one part of memory cells when performing the programming operation.

4. The memory device of claim 1, wherein the selected memory block comprises:
a common source line;
a plurality of bit lines, extending along a first direction and arranged along a second direction; and
a plurality of word lines, extending along a plane defined by the first direction and the second direction, and arranged along a third direction, wherein the first direction, the second direction and the third direction are non-parallel to each other, each of the plurality of target memory cell strings is respectively coupled between a corresponding bit line of the plurality of bit lines and the common source line, memory cells of each of the plurality of target memory cell strings are connected in series along the third direction, each of memory cells of each of the plurality of target memory cell strings is respectively coupled to a corresponding word line of the plurality of word lines.

5. The memory device of claim 4, wherein the control circuit applies the first erasing voltage to at least one of the common source line and the plurality of bit lines to perform the first erasing operation, and applies the second erasing voltage to at least one of the common source line and the plurality of bit lines to perform the second erasing operation.

6. The memory device of claim 4, wherein a remaining part of memory cells of each of the plurality of target memory cell strings that does not perform the second erasing operation is floated.

7. The memory device of claim 4, wherein the selected memory block further comprises:
a first dummy word line, extending along the plane defined by the first direction and the second direction; and
a second dummy word line, extending along the plane defined by the first direction and the second direction, the plurality of word lines are arranged between the first dummy word line and the second dummy word line.

8. The memory device of claim 7, wherein the selected memory block further comprising:
a third dummy word line, arranged between the first dummy word line and the second dummy word line, and the plurality of word lines are divided into a first word line group and a second word line group by the third dummy word line.

9. The memory device of claim 8, wherein the control circuit applies substantially zero voltage to at least one of the first word line group and the second word line group when performing the second erasing operation.

10. The memory device of claim 8, wherein the control circuit floats at least one word line adjacent to the third dummy word line in the first word line group and the second word line group when performing the second erasing operation.

11. A operating method for a memory device, wherein the memory device comprises a memory array, wherein the memory array comprises a plurality of memory blocks, wherein the operating method comprises:
- providing a first erasing voltage to perform a first erasing operation on a plurality of target memory cell strings of a selected memory block in the plurality of memory blocks;
- performing a programming operation on the plurality of target memory cell strings after the first erasing operation; and
- providing a second erasing voltage to perform a second erasing operation on at least one part of memory cells of each of the plurality of target memory cell strings after the programming operation, wherein the second erasing voltage is lower than the first erasing voltage.

12. The operating method of claim 11, wherein a difference between the first erasing voltage and second erasing voltage is in a range of 7 volts to 13 volts.

13. The operating method of claim 11, wherein providing the second erasing voltage to perform the second erasing operation on the at least one part of memory cells of each of the plurality of target memory cell strings comprises:
- applying substantially zero voltage to one or more corresponding word lines connected to the at least one part of memory cells when performing the programming operation.

14. The operating method of claim 11, wherein the selected memory block comprises:
- a common source line;
- a plurality of bit lines, extending along a first direction and arranged along a second direction; and
- a plurality of word lines, extending along a plane defined by the first direction and the second direction, and arranged along a third direction, wherein the first direction, the second direction and the third direction are non-parallel to each other, each of the plurality of target memory cell strings is respectively coupled between a corresponding bit line of the plurality of bit lines and the common source line, memory cells of each of the plurality of target memory cell strings are connected in series along the third direction, each of memory cells of each of the plurality of target memory cell strings is respectively coupled to a corresponding word line of the plurality of word lines.

15. The operating method of claim 14, wherein:
providing the first erasing voltage to perform the first erasing operation on the plurality of target memory cell strings of the selected memory block in the plurality of memory blocks comprises:
- applying the first erasing voltage to at least one of the common source line and the plurality of bit lines to perform the first erasing operation; and providing the second erasing voltage to perform the second erasing operation on the at least one part of memory cells of each of the plurality of target memory cell strings comprises:
- applying the second erasing voltage to at least one of the common source line and the plurality of bit lines to perform the second erasing operation.

16. The operating method of claim 14, wherein providing the second erasing voltage to perform the second erasing operation on the at least one part of memory cells of each of the plurality of target memory cell strings comprises:
- floating a remaining part of memory cells of each of the plurality of target memory cell strings that do not perform the second erasing operation.

17. The operating method of claim 14, wherein the selected memory block further comprises:
- a first dummy word line, extending along the plane defined by the first direction and the second direction;
- a second dummy word line, extending along the plane defined by the first direction and the second direction, the plurality of word lines are arranged between the first dummy word line and the second dummy word line.

18. The operating method of claim 17, wherein the selected memory block further comprising:
- a third dummy word line, arranged between the first dummy word line and the second dummy word line, and the plurality of word lines are divided into a first word line group and a second word line group by the third dummy word line.

19. The operating method of claim 18, wherein providing the second erasing voltage to perform the second erasing operation on the at least one part of memory cells of each of the plurality of target memory cell strings further comprises:
- applying substantially zero voltage to at least one of the first word line group and a second word line group when performing the second erasing operation.

20. The operating method of claim 18, wherein providing the second erasing voltage to perform the second erasing operation on the at least one part of memory cells of each of the plurality of target memory cell strings further comprises:
- floating at least one word line adjacent to the third dummy word line in the first word line group and the second word line group when performing the second erasing operation.

* * * * *